United States Patent [19]

Shaffer et al.

[11] 4,200,901
[45] Apr. 29, 1980

[54] MULTILAMP PHOTOFLASH UNIT WITH ELECTROSTATIC PROTECTION

[75] Inventors: John W. Shaffer; Daniel W. Bricker; Emery G. Audesse, all of Williamsport, Pa.

[73] Assignee: GTE Sylvania Incorporated, Stamford, Conn.

[21] Appl. No.: 644,674

[22] Filed: Dec. 29, 1975

[51] Int. Cl.² .................................. G03B 15/02
[52] U.S. Cl. .................................. 362/5; 362/16
[58] Field of Search .................. 240/1.3, 103 R; 431/95 A, 95 R; 174/68.5; 362/5, 11, 13, 15, 16

[56] References Cited

U.S. PATENT DOCUMENTS

| 3,894,226 | 7/1975 | Hanson | 240/1.3 |
| 3,935,442 | 1/1976 | Hanson | 240/1.3 |
| 3,941,992 | 3/1976 | Blount et al. | 240/1.3 |
| 4,019,043 | 4/1977 | Blount | 240/1.3 |
| 4,036,578 | 7/1977 | Herman | 240/1.3 X |

*Primary Examiner*—Fred L. Braun
*Attorney, Agent, or Firm*—Edward J. Coleman

[57] ABSTRACT

A photoflash lamp array comprising a plurality of high-voltage type flashlamps mounted on a printed circuit board containing circuitry for sequentially igniting the flashlamps in response to successive high-voltage firing pulses applied thereto. Each of the flashlamps has a pair of lead-in wires connected to the circuit board by eyelets which project through to the opposite side of the board, one lead of each lamp being connected via its respective eyelet to a common circuit conductor. Electrostatic protection is provided by a conductive shield of planar configuration disposed parallel to the circuit board and spaced therefrom on the side opposite that on which the lamps are disposed. Selected ones of the common circuit connected eyelets project from the back of the circuit board in a manner which maintains the spacing between the shield and circuit board, to prevent short circuiting of leads, and facilitates electrical connection of the planar shield to the common circuit conductor.

10 Claims, 5 Drawing Figures

MULTILAMP PHOTOFLASH UNIT WITH ELECTROSTATIC PROTECTION

BACKGROUND OF THE INVENTION

This invention relates to multilamp photoflash devices having circuit means for igniting the flashlamps and, more particularly, to high-voltage photoflash arrays with improved means for providing electrostatic protection.

Numerous multilamp photoflash arrangements with various types of sequencing circuits have been described in the prior art, particularly in the past few years. A currently marketed photoflash unit described in U.S. Pat. No. 3,894,226, and referred to as a flip flash, employs high-voltage type lamps adapted to be ignited sequentially by successively applied high-voltage firing pulses from a source such as a camera-shutter-actuated piezoelectric element. The flip flash unit comprises a planar array of eight high-voltage type flashlamps mounted on a printed circuit board with an array of respectively associated reflectors disposed therebetween. The lamps are arranged in two groups of four disposed on the upper and lower halves respectively of the rectangular-shaped circuit board. A set of terminal contacts at the lower end of the unit is provided for activation of the upper group of lamps, while a set of terminal contacts at the top of the unit is operatively associated with the lower group of four lamps. The application of successive high-voltage pulses (e.g., 500 to 4,000 volts from, say, a piezoelectric source controlled by the shutter of a camera in which the array is inserted) to the terminal contacts at the lower end of the unit causes the four lamps at the upper half of the array to be sequentially ignited. The array may then be turned end for end and again inserted into the camera in order to flash the remaining four lamps.

The flip flash circuit board comprises an insulating sheet of plastic having a pattern of conductive circuit traces, including the terminal contacts, on one side. The flashlamp leads are electrically connected to these circuit traces by means of eyelets secured to the circuit board and crimped to the lead wires. The circuitry on the board includes six printed, normally opened, connect switches that chemically change from a high to low resistance, so as to become electrically conducting after exposure to the radiant heat energy from an ignited flashlamp operatively associated therewith. The purpose of these switches is to promote lamp sequencing and one-at-a-time flashing. The four lamps of each group are arranged in parallel with three of the four lamps being connected in series with their respective thermal connect switches. Initially, only the first of the group of four lamps is connected directly to the voltage pulse source. When this first group flashes, it causes its associated thermal connect switch (which is series connected with the next, or second lamp) to become permanently conductive. Because of this action, the second lamp of the group of four is connected to the pulse source. This sequence of events is repeated until all four lamps have been flashed.

The primers used in the high-voltage type flashlamps employed in such arrays are designed to be highly sensitive toward high-voltage breakdown. Electrical energies as low as a few microjoules are sufficient to promote ignition of such primers and flashing of the lamps. This high sensitivity is needed in order to provide lamps that will function reliably from the compact and inexpensive piezoelectric sources that are practical for incorporation into modern miniature cameras. The mechanical energy delivered to the piezoelectric crystal, and thereby the electrical output energy therefrom, is limited both by the size of the device and by the necessity to minimize camera vibration and motion during use.

The high degree of electrical sensitivity needed in high-voltage flashlamps gives rise to distinct problems of inadvertent flashing during handling of the array package. Any static charges on equipment and personnel can cause the lamps to flash. This problem is discussed in the aforementioned U.S. Pat. No. 3,894,226, and one means described therein for protecting against inadvertent flashing is to make the reflector member electrically conductive, such as fabricating it of metal or metal-coated plastic and electrically connecting the reflector to an electrical "ground" portion of the circuitry on the circuit board. Thus, the reflector member functions as an electrical shield and increases the stray capacitance to ground of the electrical "ground" of the circuitry, reducing the possibility of accidental flashing of lamps by electrostatic voltage charge on a person or object touching the array.

A further approach used in marketed flip flash arrays for providing electrostatic protection is to metalize the back surface of the circuit board and connect that metalized surface to the common circuit conductor run, for example, by means of an eyelet through the board, thereby providing a planar conductive shield behind the lamps and most of the circuitry.

Although the above-described protective packaging features are effective with respect to various sources of electrostatic discharges, we have observed that commercial arrays employing such shield elements are still subject to inadvertent electrostatic-caused flashing of the lamps contained therein. More specifically, testing has shown that the most susceptible mode involves imposition of a voltage gradient between the common circuit terminal contact and the exterior back face of the array. Depending upon the innate sensitivity of the lamps used, from about five percent to nearly fifty percent of all lamps tested in this mode may flash. A standardized test, referred to as a rear surface electrostatic flash test, uses a 10,000 volt DC pulse from a charged capacitor applied between the common circuit terminal and a metal plate contacting the exterior of the back cover of the array.

SUMMARY OF THE INVENTION

In view of the foregoing, it is an object of this invention to provide a photoflash array having an improved means for significantly reducing inadvertent electrostatic flashing of high-voltage lamps contained therein.

These and other objects, advantages and features are attained in accordance with the principles of this invention by providing a conductive shield of planar configuration which is spaced from the back surface of the circuit board and connected to the common circuit conductor. The use of such a common-connected conductive shield between the hot lamp leads (and their attachment means) and the back surface of the array package has been observed to significantly reduce the probability of inadvertent lamp flashing due to externally applied to electrostatic charges. In a preferred embodiment, a conductive coating is applied to the circuit-board side of a flash indicator insert on the back of the array. Electrical contact with the common circuit conductor may be achieved by way of the common lead-in wires of the lamps and eyelets that extend through the rear of the circuit board. The extension, or projection, of these leads and eyelets at an angle from the rear of the board serves to provide contact with the conductive corona shield layer and maintain a spacing between that shield and the circuit board itself. In order to prevent short circuiting of the lamps, the "hot" eyelet (and lead-in wire) of each lamp is bent up tightly in contact with the rear surface of the circuit board.

BRIEF DESCRIPTION OF THE DRAWINGS

This invention will be more fully described hereinafter in conjunction with the accompanying drawings in which.

DESCRIPTION OF PREFERRED EMBODIMENT

Figure 1:
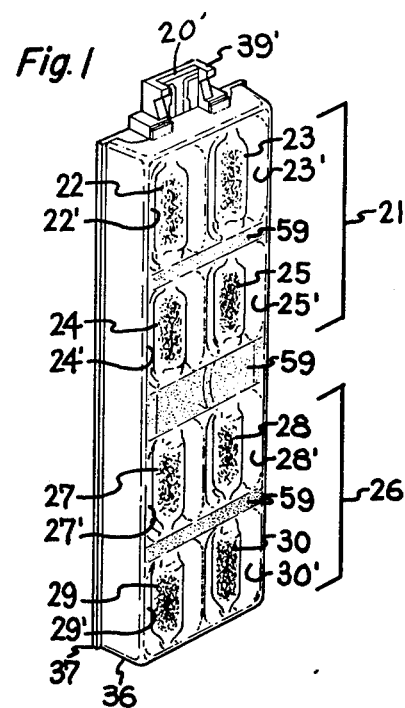
FIG. 1 is a perspective view of a multilamp photoflash array.
Figure 2:
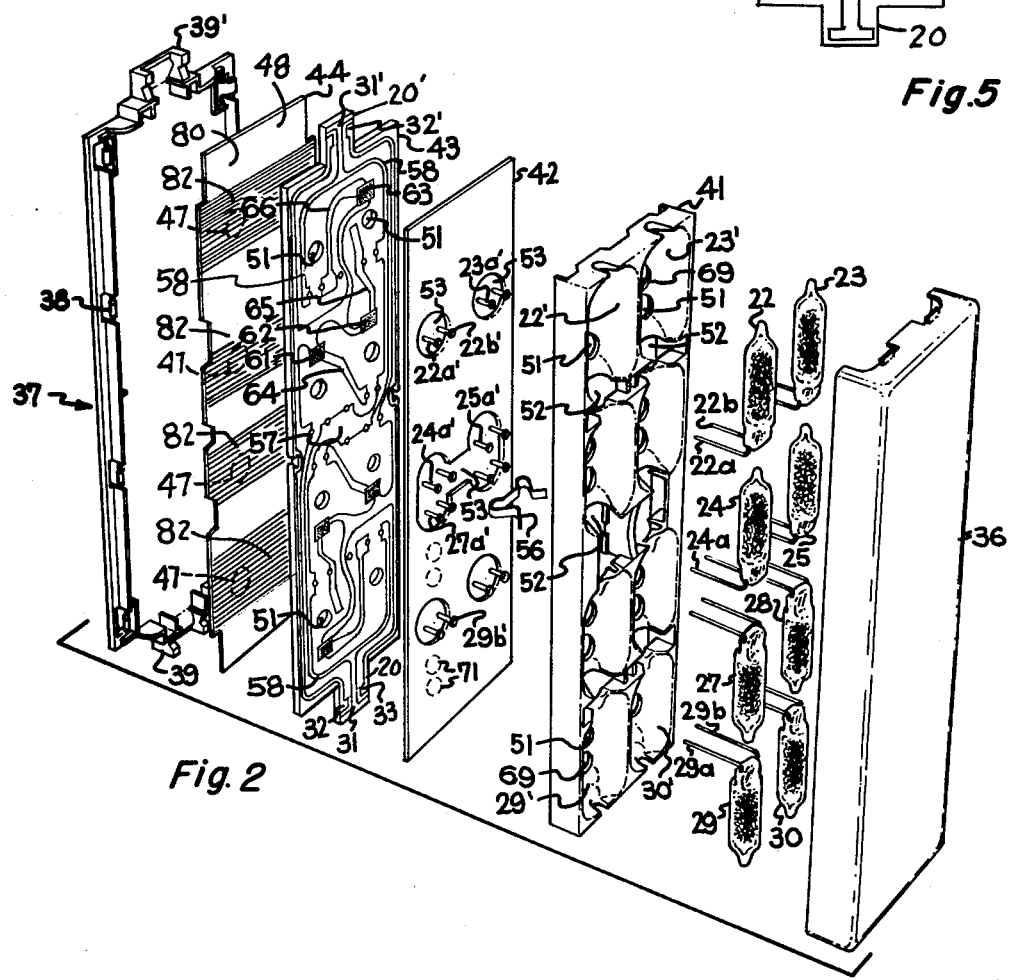
FIG. 2 is an exploded view of the lamp array of FIG. 1 showing the internal parts including the planar shield of this invention.

The concepts of the present invention are particularly useful as embodied in a multilamp photoflash array similar to the type described in U.S. Pat. No. 3,894,226 and referred to as a flip flash. As illustrated in FIGS. 1 and 2, this multilamp unit is of the planar array type which contains a plurality of electrically fixed flashlamps and is provided with a plug-in connector tab 20 at the lower side or end thereof, adapted to fit into a socket of a camera or flash adaptor. The array is provided with a second plug-in connector tab 20' at the top side or end thereof, whereby the array unit is adapted to be attached to the camera socket in either of two orientations, i.e., with either the tab 20 or tab 20' plugged into the socket. The array is provided with an upper group 21 of flashlamps 22, 23, 24 and 25, and a lower group 26 of flashlamps 27, 28, 29 and 30, the lamps being arranged in a planar configuration. Reflectors 22', etc., are disposed behind their respective flashlamps so that as each lamp is flashed, its light is projected forwardly of the array. The lamps are arranged and connected so that when the array is connected to a camera by the connector 20, only the upper group 21 of lamps will be flashed, and when the array is turned end for end and connected to the camera by the other connector 20', only the then upper group 26 of lamps will be flashed. By this arrangement, only lamps relatively far from the camera lens axis are flashable, thus reducing the undesirable red-eye effect.

The construction of the array comprises front and back housing members 36 and 37 which preferably are made of plastic and are provided with interlocking members 38 which can be molded integrally with the housing members and which lock the housing members together in final assembly to form a unitary flash array structure. In the preferred embodiment shown, the front housing member 36 is a rectangular concavity and the back housing member 37 is substantially flat and includes integral extensions 39 and 39' at the ends thereof which partly surround and protect the connect tabs 20 and 20' and also function to facilitate mechanical attachment to the camera socket. Sandwiched between the front and back housing members 36 and 37, in the order named, are the flashlamps 22, etc., an electrically conductive unitary reflector member 41 (preferably of aluminum-coated plastic) shaped to provide the individual reflectors 22', etc., an electrically insulating sheet 42, a printed circuit board 43 provided with integral connector tabs 20 and 20', and an indicia sheet 44 which may be provided with information and trademarks, and other indicia such as flash indicators 47 (also see FIG. 3) located behind the respective lamps and which change color due to heat and/or light radiation from a flashing lamp, thus indicating at a glance which of the lamps have been flashed and not flashed. As described in the aforementioned U.S. Pat. No. 3,894,226, small openings 71, indicated with dashed lines in FIG. 2, can be provided through the sheet 42 in alignment with the openings 51 and 69 in the reflector unit 41 to improve radiation transfer, if desired.

The indicia sheet 44 may be of paper or thin cardboard and provided with openings (also see FIG. 3) where the flash indicators 47 are desired and flash indicator material, such as a sheet-like heat sensitive plastic material, for example bi-axially oriented polypropylene, which shrinks or melts when subjected to heat or radiant energy from an adjacent flashing lamp, thus, effectively changing the color of the openings in the indicia sheet 44. A single flash indicator sheet 48 may be arranged over all of the flash indicator openings. Openings 51 are provided through the reflector unit 41 and the circuit board 43 to facilitate radiation from the flashing lamps reaching the flash indicator (also see FIG. 3). The rear housing member 37 is transparent (either of clear material or provided with window openings) to permit viewing of the indicia on the indicia sheet 44. The front housing member 36 is transparent at least in front of the lamps 22, etc., to permit light from the flashing lamps to emerge forwardly of the array and may be tinted to alter the color of the light from the flashlamps.

The height and width of the rectangular array are substantially greater than its thickness, and the height and width of the reflector member 41, insulating sheet 42 and circuit board 43 are substantially the same as the interior height and width of the housing member 36 to facilitate holding the parts in place.

The tab 20, which is integral with the circuit board 43, is provided with a pair of electrical terminals 31 and 32, and similarly the tab 20' is provided with a pair of terminals 31' and 32' for contacting terminals of a camera socket for applying firing voltage pulses to the array. Each tab is provided with a third terminal 33 and 33' respectively which functions to electrically short the circuitry of the inactive lower group of lamps when the array is plugged into a socket. The terminals 31 and 31' are shown as having a lateral "T-bar" configuration for temporarily shorting the socket terminals while the array is being plugged in, to discharge any residual voltage charge in the firing pulse source and also to reduce the likelihood of the lamps being accidentally flashed by electrostatic voltage when the array is handled.

The circuit board 43 has a printed circuit thereon, as will be described, for causing sequential flashing of the lamps by firing voltage pulses applied to the terminals 31, 32 or 31', 32'. The top and bottom halves of the printed circuitry preferably are reversed mirror images of each other. The lead-in wires 22a, 22b, etc., of the lamps 22, etc. may be attached to the circuit board 43 in various ways such as by means of metal eyelets 22a', 22b', etc., secured in respective lead-through holes in the circuit board (see FIG. 3). The lead-in wires 22a, 22b, etc., pass through openings 52 in the reflector member 41 and through openings 53 in the insulating sheet 42 and into or through the respective pairs of eyelets 22a', 22b', etc., and the ends of the eyelets are crimped to hold the lead wires and make electrical contact thereto. The heads of the eyelets are rolled over in electrical contact with the circuit of the circuit board. A metal clip 56 is clipped onto the reflector member 41, which reflector is preferably made of metal-coated plastic, and the rear of the clip 56 rests in touching contact against an area 57 of an electrical ground circuit comprising a continuous conductor-run 58 on the board and which includes, or is connected to, the terminals 31 and 31' and which is connected in common and makes contact with one of each of the pairs of connector eyelets for each of the lamps 22, etc., whereby the reflector unit 41 additionally functions as an electrically grounded shield. More specifically, in the upper half of the circuit board, the common circuit conductor 58 is connected electrically with a respective contact area of the eyelets 22a, 22b', 24b', and 25b'.

Areas 59 on the transparent front housing member 36 may be made opaque or partly opaque, such as by making the surface roughened at these areas, to fully or partially conceal the lamp lead-in wires 22a, 22b etc., and/or the lower portions of the lamps, for improved appearance of the array.

The circuit board terminal 32 is part of a conductor run that is electrically connected to lead-in wire 24a of lamp 24 at the eyelet 24a' and terminates at radiation switches 61, 62 and 63 respectively positioned near lamps 24, 25 and 23. A circuit board conductor run 64 is connected electrically to the remaining lead-in wire of flashlamp 25 at eyelet 25a' and terminates at the radiation switch 61. A circuit board conductor run 65 is connected to the remaining lead-in wire of flashlamps 23 at eyelet 23a' and terminates at the radiation switch 62. Similarly, a circuit board conductor run 66 is connected to the remaining lead-in wire of flashlamp 22 at eyelet 22b' and terminates at radiation switch 63.

Figure 3:
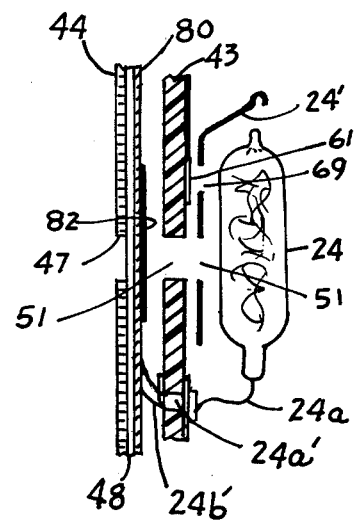
FIG. 3 is a sectional schematic showing the alignment of an individual lamp of the array of FIGS. 1 and 2 with respect to the remainder of the assembly, and particularly illustrating a preferred means for contacting and spacing the rear planar shield in accordance with the invention.

The radiation switches 61, 62 and 63 respectively are in contact with and bridge across the circuit runs that are connected to them. The material for the radiation switches may be suitable material initially having an open circuit or high resistance, the resistance thereof becoming zero or of a low value when the material receives radiation in the form of heat and/or light from a respective adjacent lamp upon the lamp being flashed. For this purpose, each of the radiation switches is respectively positioned behind and near to a flashlamp 24, 25, 23. Windows in the form of transparent sections or openings 69 may be provided in the reflectors in front of the switches as shown in FIG. 3 to facilitate radiation transfer. A suitable material for the radiation switches is silver oxide dispersed in a binder such as polyvinyl resin. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown on the upper part of the circuit board and, therefore, will not be described in detail. It will be noted that the circuit runs from the plugged-in terminals 31 and 32 at the lower part of the circuit board, extend upwardly so as to activate the circuitry in the upper half of the circuit board. Similarly, when the unit is turned around and tab 20' is plugged into a socket, the circuit board terminals 31' and 32 will be connected to and activate the lamps which then will be in the upper half of the circuit board, and hence in the upper half of the flash unit. This accomplishes, as has been stated, the desirable characteristic whereby only the group of lamps relatively farthest away from the camera lens axis will be flashed, thereby reducing or eliminating the undesirable red-eye effect.

In accordance with the present invention, we have found that the provision of a corona shield of electrically conducting material between the rear surface of the circuit board and the exterior surface of the array essentially eliminates the mode of undesired electrostatic flashing exhibited under a rear surface electrostatic flash test of the type mentioned hereinbefore. The corona shield of conductive material is electrically connected to, or in contact with, the common circuit conductor run; and, of course, it is necessary to prevent lamp short circuiting by the conductive corona shield. A particular aspect of the present invention is the use of a common-connected conductive member between the "hot" lamp leads (and their attachment means) which project from the rear of the circuit board and the proximal array surface.

Figure 4:
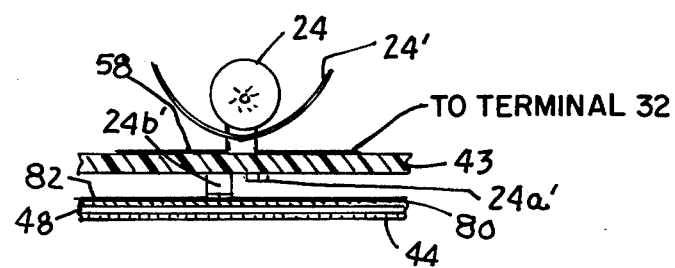
FIG. 4 is a sectional schematic top view of FIG. 3.

More specifically, a conductive shield of planar configuration is disposed parallel to the plane of the circuit board and spaced therefrom on the side opposite the surface containing the above-described printed circuitry, and the shield is electrically connected to the common circuit conductor run. Referring particularly to FIGS. 2-4, a preferred embodiment is illustrated in which the planar conductive shield is provided by a conductive surface coating 80 on the side of the plastic flash indicator sheet 48 facing the circuit board. A relatively easy and economical means of providing such a shield is to use a conductive carbon-containing ink or similar coating applied to the indicator sheets during their manufacture. One preferred material for such use is a colloidal graphite suspension in isopropanol. An alternative approach is to provide the conductive layer 80 by a metallic coating, such as by vacuum metalizing with aluminum. If a somewhat reflective surface results, the side of the shield 80 facing the circuit board should be provided with a blackened surface 82, at least in the areas in alignment with the apertures 51 in the circuit board, so as to absorb heat more rapidly and facilitate radiant activation of the flash indicators 47 during operation of the array. Yet another alternative is to fabricate the indicator sheet 48 of a foil containing laminate or of a sheet of conductive plastic, whereby the shield and flash indicators are comprised of the same sheet of material.

In the illustrated embodiment, electrical contact between the planar shield 80 and common circuit conductor 58 is achieved by way of the common-connected lead-in wires of the lamps and associated eyelets which extend, or project, through the rear of the circuit board.

Further, the projection of these eyelets at an angle from the rear of the circuit board serves to maintain a spacing between the conductive corona shield layer 80 and the circuit board. In order to prevent short circuiting of the lamps, the "hot" eyelet and lead-in wire of each lamp (i.e., those connected via switching circuitry to terminal 32 or 32' (are bent over toward the rear surface of the circuit board to prevent contact between the such eyelet or lead-in wire and the planar shield. For example, as illustrated in FIGS. 3 and 4, the projecting portion of eyelet 24b' (which is connected via its associated printed circuit contact area to the common conductor run 58) is in contact with the planar shield 80 and thereby provides both electrical connection and a physical spacing between the shield and circuit board, while the "hot" eyelet 24a' is bent up tightly in contact with the rear surface of the circuit board.

Figure 5:
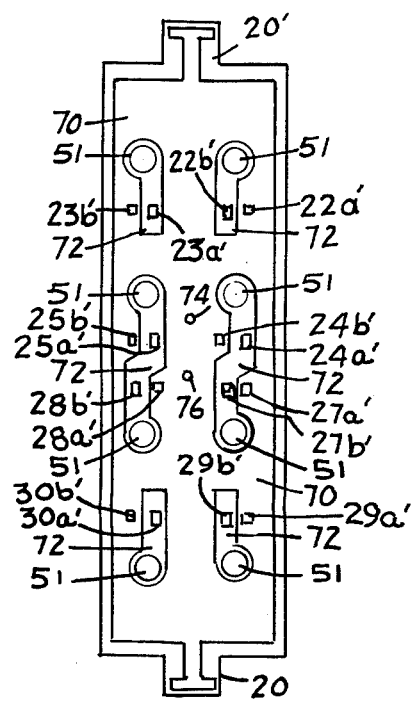
FIG. 5 is an elevational view of the back of the printed circuit board employed in the lamp of FIGS. 1 and 2.

The overall configuration of the array eyelets is illustrated in FIG. 5 which shows the rear of the circuit board. It will be noted that all the "hot" eyelets (namely, 22b', 23a', 24a', 25a', 27b', 28b' 29b' and 30a') are pressed tightly against the board. A uniform spacing between the board and shield, along with electrical connection to the common conductor, is provided by the projecting common-connected eyelets 22a', 23b', 24b', 25b', 27a', 28a', 29a' and 30b. Of course, if desired, only selected ones of the common-connected eyelets need be formed to project in contact with the shield 80, e.g., 22a', 23b', 29a' and 30b'.

FIG. 5 also illustrates use of the prior art conductive shield 70 directly on the rear surface of the circuit board. However, when using the planar shield 80, in accordance with the invention, shield 70 may be dispensed with, if desired. Shield 70 may comprise a hot-stamped aluminum coating on the rear of the printed circuit board 43 with spaces 72 provided in the areas about the "hot" lead eyelet holes to avoid inadvertent short circuiting. The conductive shield coating 70 is electrically connected to the common circuit conductor by means of eyelets (not shown) secured through holes 74 and 76 which thereby provide a direct connection means between the back shield coating 70 and area 57 of the electrical ground circuit run 58 on the front of the board; if desired, these eyelets may be extended to provide contact with planar shield 80 in which event, coating 70 could be dispensed with if desired. Employing eyelets through holes 74 and 76 to provide electrical contact with shield 80 is particularly useful if shield 80 is provided by metallizing, or otherwise coating, the inside surface of indicia sheet 44, holes are provided in shield 80 in alignment with the indicator openings 47, and the plastic flash indicator sheet is juxtaposed with shield 80 on the side thereof facing the circuit board in a manner covering the holes in the shield.

The circuit on the circuit board 43 of FIG. 2 functions as follows. Assuming that none of the four lamps in the upper half of the unit have been flashed, upon occurence of a first firing pulse applied across the terminals 31, 32, this pulse will be directly applied to the lead-in wires of the first connected flashlamp 24, flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash.

When the next firing pulse occurs, it is applied to the lead-in wires of the second lamp 25 via the now-closed radiation switch 61 whereupon the second lamp 25 flashes, thereby causing radiation switch 62 to assume zero or low resistance, and the second lamp 25 now has an open circuit or high resistance between its lead-in wires. When the next firing pulse occurs, it is applied via now-closed radiation switch 62 to the third lamp 23, thereby firing the lamp which becomes an open circuit, and the radiation from it causes the radiation switch 63 to become essentially a closed circuit across its terminals. Thus, the next firing pulse will be applied via now-closed radiation switch 63 to the lead-in wires of the fourth flashlamp 22, thereupon causing the lamp to flash. Since this lamp is the last lamp in the active circuit, it does not matter whether its lead-in wires are an open or closed circuit after flashing. Additional flash-lamps, radiation switches and electrical conductors can be employed, if desired, using the just-described principles. When the flash unit is turned around and the other connector tab 20' attached to the camera socket, the group of lamps that then become uppermost and relatively farthest away from the lens axis will be in an active circuit and will be flashed in the same manner as has been described. In a preferred embodiment, the lamps 22, etc., are high-voltage types requiring 2,000 volts, for example, at low current for flashing, and they can be fired by impacting or stressing a piezoelectric element in the camera.

The advantage of this invention is that it reliably provides a very significant improvement is electrostatic protection for high-voltage type multilamp units in a way that is inexpensive and which leads itself readily to automated lamp manufacturing processes.

Tests were conducted which illustrate the concepts disclosed herein as applied to the above-described multilamp photoflash array units. Each test, referred to as a rear surface electrostatic flash test, comprised the application of a 10,000 volt discharge potential between the "T-bar" terminal 31 (or 31') on the connector tab 18 (or 18') and a metallic plate positioned against the rear surface of the back cover, or housing member, 37 of the array in back of the group 21 (or 26) of four lamps associated with that connector.

Test I.

A five-mil thick Mylar film was coated on one surface with colloidal graphite and positioned between the rear of the circuit board and the flash indicator insert 48; the graphite coating faced toward the circuit board. The "hot" lamp leads and eyelets were bent tightly against the rear surface of the circuit board to prevent short circuiting.

Control for I

Same lamps and array components as in Test I but no Mylar insert and no bent lamp leads.

|  | No. Arrays | No. Lamps | Lamps Flashed | Percent Lamps Flashed |
| --- | --- | --- | --- | --- |
| Control I | 30 | 240 | 100 | 41.7 |
| Test I | 28 | 224 | 2 | 0.9 |

Test II

Same as Test I above with graphite-coated Mylar but different lamp group.

Test III

Same lamps as Test II, with graphite directly on the circuit board side of flashed lamp indicator sheet 48; no Mylar insert was used.

Control II for Tests II and III

Same lamps as used in Tests II and III, with no conductive corona shield 80.

|  | No. Arrays | No. Lamps | Lamps Flashed | Percent Flashed Flashed |
|---|---|---|---|---|
| Control II | 24 | 192 | 57 | 29.7 |
| Test II | 29 | 232 | 1 | 0.4 |
| Test III | 27 | 216 | 2 | 0.9 |

These tests show a very significant reduction in lamp susceptibility toward flashing due to imposed electrical stress when using a planar corona shield in accordance with the invention.

Although the invention has been described with respect to a specific embodiment, it will be appreciated that modifications and changes may be made by those skilled in the art without departing from the true spirit and scope of the invention. For example, the back cover of the array could be made of metal or other conductive material or be of metallized plastic. In this case, contact with the common circuit could be attained with the hot-stamped aluminum pattern on the back of the circuit board at the ends of the array where the indicator insert does not normally extend. A wire mesh or screen could be used as the conductive shield. A separate insert, such as metalized plastic or foil, could be interposed between the circuit board and flash indicator.

What we claim is:

1. A photoflash lamp array comprising a circuit board having circuitry disposed on a surface thereof, a plurality of flashlamps positioned over said surface and each having a pair of lead-in wires connected to said circuitry, said circuitry being provided for igniting said flashlamps, said circuitry including a group of pairs of flashlamp contact areas and a common circuit conductor connected electrically with one contact area of each of said pairs thereof, a plurality of lead-through holes in said circuit board each associated with a respective one of said contact areas, a plurality of eyelets each secured in a respective one of said lead-through holes with the head of the eyelet rolled over onto the associated contact area and the other end of the eyelet projecting through to the opposite side of said circuit board, each of said flashlamp lead-in wires passing through a respective eyelet and secured thereto by a crimp in the projecting end of the eyelet, each pair of said flashlamp lead-in wires being electrically connected to a respective pair of said contact areas associated with said eyelets, said circuit board having a connector tab depending therefrom with first and second terminals thereon, said common circuit conductor being connected to the first terminal of said tab connector, means disposed on said circuit board surface for connecting the second terminal of said tab connector to the other contact area of each of said pairs thereof, a conductive shield of planar configuration disposed parallel to the plane of said circuit board and spaced therefrom on the side opposite said surface thereof whereby said projecting eyelets are shielded, and means for maintaining a substantially uniform spacing between said planar shield and said circuit board and for electrically connecting said planar shield to said common circuit conductor comprising projecting portions of selected ones of said eyelets associated with contact areas connected to said common circuit conductor, said eyelet-projecting portions being in contact with said planar shield, and each of said crimped projecting ends of the eyelets associated with said contact areas connectable to the second terminal of said tab connector being bent over toward the surface of said circuit board to prevent contact between the eyelet and planar shield.

2. The array of claim 1 wherein said circuit board has printed circuitry thereon, said printed circuitry is provided for sequentially igniting said flashlamps, and said means on said circuit board surface for connecting the second terminal of said tab connector with said other contact area of each of the pairs thereof comprises switching circuitry.

3. The array of claim 2 further including a plurality of reflectors respectively associated with said flashlamps and positioned between said lamps and said circuit board, said reflectors having a metallic surface which is electrically connected to said common circuit conductor, said circuit board having a plurality of apertures therethrough each in alignment with a respective one of said flashlamps, each of said reflectors having an aperture in alignment with a respective one of said apertures in said circuit board, and a plurality of radiant-energy-activated flash indicators juxtaposed with said planar shield and each in alignment with a respective one of the apertures in said circuit board, whereby ignition of a flashlamp is operative via the resulting radiation through the apertures aligned therewith to activate a respective one of said flash indicators.

4. The array of claim 3 wherein said planar shield has a blackened surface on the side facing said circuit board at least in the areas in alignment with the apertures in said circuit board, thereby facilitating radiant activation of said flash indicators.

5. The array of claim 3 wherein said planar shield and flash indicators are comprised of the same sheet of material.

6. A photoflash array comprising a plurality of flashlamps each having a pair of lead-in wires, a circuit board carrying circuitry for flashing said lamps and having pairs of connector areas for the respective pairs of lead-in wires of said lamps, pairs of openings through said circuit board at said pairs of connector areas, respectively, a plurality of pairs of eyelets respectively positioned through said pairs of openings with the eyelet shanks extending from one side of said circuit board, said flashlamps being positioned over the other side of the circuit board and their pairs of lead-in wires respectively extending into and connected to said pairs of eyelets, and a sheet-like electrically conductive shield member comprising a conductive surface facing said circuit board and positioned substantially parallel to said one side of the circuit board, one of the eyelet shanks of one or more of said pairs thereof extending farther from said one side of the circuit board than the other eyelet shank of the pair and contacting against said shield member conductive surface to space it from said circuit board, said farther extending eyelets being connected to electrical ground of said circuitry.

7. An array as claimed in claim 6, in which the shanks of at least one of said pairs of eyelets are bent substantially sideways in a manner such that one of them extends farther from the circuit board than does the other, and in which said shield member comprises a sheet of paper containing a metal coating on one side thereof and positioned with the metal coating facing said circuit board and in contact against one or more of said farther extending eyelets.

8. An array as claimed in claim 7, in which said shield member includes a layer of flash indicator material over said metal coating, and in which one or more of said farther extending eyelets penetrates through said flash indicator material to make said contact against the metal coating.

9. An array as claimed in claim 7, containing eight flash lamps arranged in two columns of four lamps each, said farther extending eyelets being provided only at a lead-in wire of each of the four lamps constituting the end lamps of both of said columns.

10. A method of making a photoflash array, comprising the steps of providing a circuit board carrying circuitry for firing flashlamps and having pairs of connector areas for lead-in wires of flashlamps, providing pairs of openings through said circuit board at said pairs of connector areas, respectively, placing a plurality of eyelets respectively through said pairs of openings so that the eyelet shanks extend from one side of the circuit board, providing a plurality of flashlamps each having a pair of lead-in wires, positioning said flashlamps over the other side of the circuit board and placing their pairs of lead-in wires respectively into said pairs of eyelets, bending said eyelet shanks substantially sideways in a manner such that one of them of at least one pair thereof extends farther from said circuit board than does the other eyelet shank of that pair, placing a sheet-like conductive shield member substantially parallel to said one side of the circuit board and in contact against at least one of said farther extending eyelet shanks, said shield member being provided with a layer of flash indicator material on the side thereof facing the circuit board, and causing at least one of said farther extending eyelet shanks to abrade and penetrate through said flash indicator so as to contact against said shield member.

* * * * *